INVENTOR
Manfred Gnadke

BY Spencer & Kaye

ATTORNEYS 3,323,513
Patented June 6, 1967

1

3,323,513
OSCILLATOR WITH CAPACITATIVE VOLTAGE DIVIDER CONSTITUTED BY A TRANSISTOR

Manfred Gnadke, Ulm (Danube), Germany, assignor to Telefunken Patentverwertungs-G.m.b.H., Ulm (Danube), Germany Filed Feb. 8, 1965, Ser. No. 431,066
Claims priority, application Germany, Feb. 13, 1964, T 25,598
9 Claims. (Cl. 128—2)

The present invention relates to a circuit, and, more particularly, to a capacitative resonant circuit in which the resonant frequency of the circuit is controlled electronically, as well as to the particular application of such a circuit to solve a certain problem.

Capacitative resonant circuits, sometimes referred to as three-point resonant circuits, and based on the conventional Colpitts oscillator, are well known in the electronic art, and are generally used as tunable oscillators. In such circuits, the elements which controls the frequency is usually constituted by a rotary capacitor, that is to say, a mechanically variable capacitor, which is one of two capacitors which together form a voltage divider. It will be appreciated that one or both of these capacitances may also be constituted by capacitance diodes whose capacitance can be varied electronically, e.g., by the application of a variable direct-current voltage, and it is the primary object of the present invention to provide an improved oscillator of this type, especially an oscillator circuit which is suitable for use in an endoradiosonde, i.e., a small, swallowable transmitter which produces an output signal that represents a characteristic of a condition prevailing within the stomach and/or intestinal tract of a patient. Such sondes are frequently used for measuring the acidity (pH-value).

With the above object in view, the present invention resides mainly in a capacitative resonant-circuit oscillator in which the capacitances of the capacitative voltage divider are constituted by the base-emitter and base-collector paths of a transistor which is operated in the cut-off region, these capacitances being varied by varying the voltages across the base and emitter and across the base and collector, respectively. It will thus be seen that, in accordance with the present invention, both the base-collector capacitance as well as the base-emitter capacitance of a transistor are utilized, the base of this transistor representing a point which, in a manner known per se, is connected with the actual transistor (or tube) of the oscillator circuit, so that the utilizaion of the additional transistor which serves to provide the capacitances can not be equated to the conventional use of a transistor for purposes of providing a capacitance.

The circuit according to the present invention can be used for purposes of frequency modulation and for controlling the frequency of an oscillator. It is a particular advantage of the circuit that the input for the control voltage is very high-ohmic. Consequently, the circuit is particularly applicable for use under circumstances where the control or regulating voltage has to be applied across a high-ohmic input. This is the case, for example, with an endoradiosonde which is used for measuring the pH-value, where the sensing device is constituted by an antimony electrode and a silver chloride electrode.

Additional objects and advantages of the present invention will become apparent upon consideration of the following description when taken in conjunction with the accompanying drawings in which:

2

Figure 1:
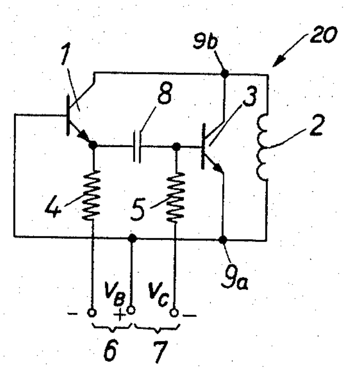
FIGURE 1 is a circuit diagram of an oscillator according to the present invention.

Referring now to the drawing and first to FIGURE 1 thereof in particular, the same shows a capacitative resonant-circuit type or so-called three-point oscillator 20 which comprises a first transistor 1 which is connected to a resonant circuit constituted by an inductance 2 and a second transistor 3, as well as to a resistor 4. The operating voltage $V_B$ is applied to the oscillator across the terminals 6. One junction *9b* of the resonant circuit is connected to the collector of transistor 1, while the other junction *9a* is connected to the base of transistor 1.

The transistor 3 is operated in the cut-off region and may be considered as a two-capacitor voltage divider, the two capacitors being constituted by the base-collector and base-emiter paths, respectively. The base of transistor 3, which can be considered as the intermediate point or tap of the capacitative voltage divider formed by this transistor is connected, insofar as alternating current is concerned, with the emitter of the transistor 1, the capacitor forming part of junction 8 being of suitable capacitance to provide such A.C.-connection.

The circuit as described so far oscillates at the frequency determined by the resonant circuit 2, 3. Here, the collector current is limited by the resistor 4 as well as by the relatively small voltage across the terminals 6. The resonant frequency is changed by varying the control voltage $V_c$ across the terminals 7; as shown in FIGURE 1, one of the terminals by which the control voltage $V_c$ is applied is connected to the junction 8 via a resistor 5. This resistor is shown as being connected to the right of the capacitor forming part of junction 8, it being the sole purpose of this capacitor to prevent the voltage applied across the terminals 7 from acting on the transistor 1. Varying the voltage across the terminals 7 has insignificant effect insofar as changing the ratio of the base-emitter capacitance of the transistor 3 to its base-collector capacitance is concerned, so that the feedback coefficient of the circuit remains substantially constant.

Figure 2:
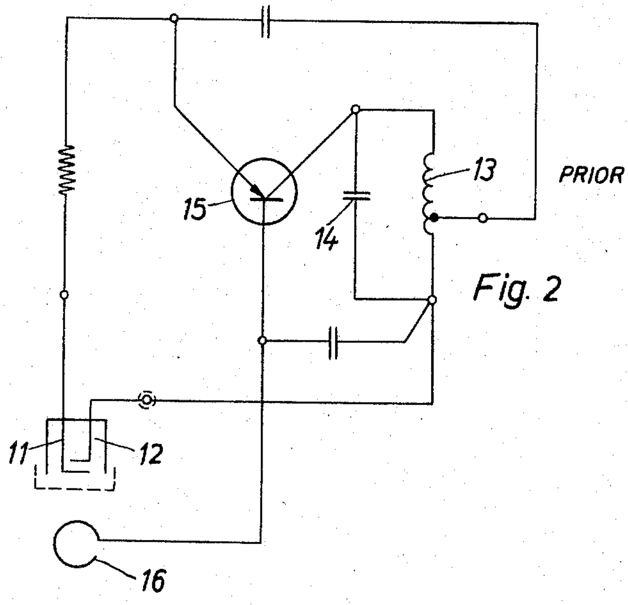
PRIOR ART Fig. 2
FIGURE 2 is a circuit diagram of a prior art oscillator.

According to a further feature of the present invention, the circuit of FIGURE 1 is used in endoradiosondes which, as described above, are small, swallowable transmitters which serve to put out a signal which represents a characteristic prevailing within the stomach and/or intestinal tract of a patient. The circuit is particularly suited for use in radioendosondes used for measuring the acidity (pH value). At first consideration, it may appear that circuit according to the present invention represents a step back in the art as compared to existing endoradiosondes, in that, despite the ever present requirement that the sonde be made as small and as inexpensive as possible, the circuit according to the present invention uses two transistors rather than only one, which would seem to run against present-day requirements. Consider, however, FIGURE 2 which shows a conventional endoradiosonde circuit, the same being in the nature of an inductive three-point or resonant circuit whose operating voltage is derived from the battery electrodes 11 and 12. The resonant circuit of the arrangement of FIGURE 2 is constituted by the inductance 13, the capacitor 14 as well as the base-collector capacitance of the transistor 15. The frequency of the oscillator is changed by changing this base-collector capacitance which, in turn, is effected by changing the voltage applied across electrodes 16 and 11. Since, in practice, the electrode 16 is made of antimony and the electrode 11 of silver chloride, the voltage across these electrodes is a function of the pH-value of the stomach or intestinal tract, so that the resonant frequency of the oscillator changes in accordance with the acidity to which the sonde is exposed. It will be noted that the electrode 11 is part of the pH-responsive element 11, 16, as well as part of the battery 11, 12.

If, then, one electrode is to serve both as part of the pH-sensing device and as part of the battery—which, it will be appreciated, is desirable from the point of view of simplicity and economy—the single transistor 15 must, for reasons of polarity, be a pnp-transistor. But, at the present time, such pnp-transistors are very expensive as compared to npn-transistors. In particular, npn-silicon transistors are today very inexpensive and it is for precisely this reason that the sonde circuit make use of npn-transistors. As explained above, this is not readily possible in the case of a single-transistor sonde circuit in which one electrode is common to both the pH-sensing device and the battery. On the other hand, the two-transistor circuit shown in FIGURE 1 readily admits of the use of npn-transistors, so that even though there are two transistors, they can be npn-transistors, and an endoradiosonde using two npn-transistors is less expensive than an endoradiosonde using one pnp-transistor. Moreover, the total number of other circuit elements in the circuit of FIGURE 1 is no larger than the number of elements in the circuit of FIGURE 2; the conventional circuit of FIGURE 2 uses, besides the induction coil, one transistor, three capacitors and one resistor, in place of which the circuit of FIGURE 1 uses two transistors, two resistors and one capacitor. Each circuit thus has, besides the induction coil, a total of five circuit elements.

It will be seen from the above that the circuit according to the present invention is less expensive than the prior art circuit and is no bulkier. Furthermore, the circuit according to the present invention, as depicted in FIGURE 1, brings with it the additional advantage that the pH-sensing probe is connected to a high-ohmic input, which is advantageous insofar as the operation of the circuit is concerned. Consequently, a more advanced endoradiosonde is obtained.

Yet another advantage of the circuit according to the present invention, over the prior art circuit, is that the temperature sensitivity of the prior art circuit is virtually eliminated inasmuch as, in the circuit according to the present invention, the temperature coefficient of the circuit and the temperature coefficient of the battery practically cancel each other.

Figure 3:
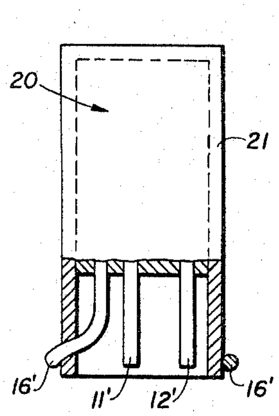
FIGURE 3 is a diagrammatic illustration of an endoradiosonde incorporating the oscillator of FIGURE 1.

FIGURE 3 is a diagrammatic illustration of endoradiosonde 21, which in its interior incorporates the oscillator 20 of FIGURE 1 and three electrodes 11′, 12′ and 16′ corresponding, respectively, to the electrodes 11, 12 and 16 of FIGURE 2. The terminals 6 and 7 of the oscillator of FIGURE 1 are connected to these three electrodes.

Excellent results are achieved with elements of the oscillator 20 having the following datas:

| | |
|---|---|
| Type of the transistors 7 and 3 | BSY 69. |
| Resistor 4 | 6 kilohms. |
| Resistor 5 | About 30 kilohms. |
| Capacitor in junction 8 | 250 $\mu\mu$f. |
| Inductance 2 | 180 $\mu$h. |
| Voltage $V_B$ | 1 v. |
| Voltage $V_c$ | Varies from 100 to 450 mv. |
| Capacity of the base-collector path of transistor 3 | Varies from about 17 to 20 $\mu\mu$f. |
| Capacity of the base-emitter path | Varies from about 17 to 20 $\mu\mu$f. |

It will be understood that the above description of the present invention is susceptible to various modifications, changes, and adaptations, and the same are intended to be comprehended within the meaning and range of equivalents of the appended claims.

What is claimed is:

1. An oscillator comprising in combination:
(a) a first transistor having a base, a collector and an emitter;
(b) a second transistor having a base, a collector and an emitter;
(c) said collectors of said transistors being connected to each other;
(d) said base of said first transistor and said emitter of said second transistor being connected to each other;
(e) feedback means having one terminal connected to said emitter of said first transistor and the other terminal to said base of said second transistor;
(f) an inductance connected across said collector and emitter of said second transistor, said inductance and second transistor together constituting the resonant circuit of said oscillator with said second transistor being a capacitative voltage divider whose tap is constituted by the base of said second transistor;
(g) means for applying an operating voltage to said collector of said first transistor; and
(h) means for applying a control voltage to said feedback means.

2. An oscillator as defined in claim 1 wherein each of said two transistors is a npn-transistor.

3. An endoradiosonde, incorporating an oscillator as defined in claim 1.

4. An endoradiosonde as defined in claim 3, further incorporating means forming a pH-sensing element and means forming a battery, said two-last mentioned means including an electrode which is common to said two means.

5. An oscillator comprising in combination:
(a) a first transistor having a base, a collector and an emitter;
(b) a second transistor having a base, a collector and an emitter;
(c) said collectors of said transistors being connected to each other;
(d) said base of said first transistor and said emitter of said second transistor being connected to each other;
(e) a capacitor having one terminal connected to said emitter of said first transistor and the other terminal to said base of said second transistor;
(f) an inductance connected across said collector and emitter of said second transistor, said inductance and said second transistor together constituting the resonant circuit of said oscillator with said second transistor being a capacitative voltage divider whose tap is constituted by the base of said second transistor;
(g) means for applying an operating voltage across the junction of said base of said first transistor with said emitter of said second transistor and the junction of said emitter of said first transistor with said one terminal of said capacitor; and
(h) means for applying a control voltage across said junction of said base of said first transistor with said emitter of said second transistor and the junction of the base of said second transistor with said other terminal of said capacitor.

6. An oscillator as defined in claim 5 wherein said means (g) include a resistor one terminal of which is connected to said junction of said emitter of said first transistor with said one terminal of said capacitor.

7. An oscillator as defined in claim 5 wherein said means (h) include a resistor one terminal of which is connected to said junction of said base of said second transistor with said other terminal of said capacitor.

8. An oscillator as defined in claim wherein each of said first and second transistors is an npn-transistor.

9. An endoradiosonde comprising an oscillator as defined in claim 5, said means (g) including a battery and said means (h) including a pH-sensing device, said two last-mentioned means including an electrode which is common to said two means.

References Cited

UNITED STATES PATENTS

| | | | |
|---|---|---|---|
| 2,888,648 | 5/1959 | Herring | 331—36 |
| 2,928,052 | 3/1960 | Wood | 331—117 |
| 3,102,217 | 8/1963 | Bullen | 331—117 |

ROY LAKE, *Primary Examiner.*

JOHN KOMINSKI, *Examiner.*